United States Patent
Clark et al.

(10) Patent No.: US 10,217,825 B2
(45) Date of Patent: Feb. 26, 2019

(54) METAL-INSULATOR-SEMICONDUCTOR (MIS) CONTACTS AND METHOD OF FORMING

(71) Applicant: Tokyo Electron Limited, Minato-ku, Tokyo (JP)

(72) Inventors: Robert D. Clark, Livermore, CA (US); Kandabara N. Tapily, Mechanicville, NY (US)

(73) Assignee: Toyko Electron Limited, Tokyo (JP)

( * ) Notice: Subject to any disclaimer, the term of this patent is extended or adjusted under 35 U.S.C. 154(b) by 0 days.

(21) Appl. No.: 15/356,220

(22) Filed: Nov. 18, 2016

(65) Prior Publication Data

US 2017/0148888 A1 May 25, 2017

Related U.S. Application Data

(60) Provisional application No. 62/257,690, filed on Nov. 19, 2015.

(51) Int. Cl.
*H01L 21/00* (2006.01)
*H01L 29/40* (2006.01)
(Continued)

(52) U.S. Cl.
CPC ...... *H01L 29/401* (2013.01); *H01L 21/28176* (2013.01); *H01L 21/28255* (2013.01); *H01L 29/517* (2013.01)

(58) Field of Classification Search
None
See application file for complete search history.

(56) References Cited

U.S. PATENT DOCUMENTS

| 4,743,953 A | 5/1988 | Toyokura et al. |
| 8,110,877 B2 | 2/2012 | Mukherjee et al. |

(Continued)

OTHER PUBLICATIONS

K.-W Ang et al. "Effective Schottky Barrier Height Modulations using Dielectric Dipoles for Source/Drain Specific Contact Resistivity Improvement," Electron Devices Meeting (IEDM), 2012 IEEE International, Dec. 10-13, 2012, San Francisco, CA, USA, pp. 18.6.1-18.6.4.

*Primary Examiner* — Reema Patel

(57) ABSTRACT

A semiconductor device containing a metal-insulator-semiconductor (MIS) contact and method of forming are described. The method includes providing a semiconductor substrate containing a contact region, depositing an insulator film on the contact region, the insulator film including a mixed oxide material containing $TiO_2$ and at least one additional metal oxide. The method further includes depositing a metal-containing electrode layer abutting the insulator film to form a MIS structure, and heat-treating the MIS structure to scavenge oxygen from the $TiO_2$ to the metal-containing electrode layer to form a MIS contact with oxygen vacancies in the $TiO_2$. According to one embodiment the at least one additional metal oxide is selected from $HfO_2$, $ZrO_2$, $Al_2O_3$, and combinations thereof, and the metal-containing electrode layer is selected from the group consisting of Ti metal, Al metal, Hf metal, Zr metal, Ta metal, Nb metal, and a combination thereof.

20 Claims, 3 Drawing Sheets

(51) Int. Cl.
*H01L 29/51* (2006.01)
*H01L 21/28* (2006.01)

(56) References Cited

U.S. PATENT DOCUMENTS

| | | | |
|---|---|---|---|
| 2007/0057302 A1* | 3/2007 | Ho | H01L 27/10861 257/301 |
| 2010/0081235 A1* | 4/2010 | Furumura | G06K 19/07749 438/113 |
| 2010/0244206 A1 | 9/2010 | Bu et al. | |
| 2012/0326245 A1 | 12/2012 | Ando et al. | |
| 2013/0071987 A1* | 3/2013 | Chen | H01L 27/1085 438/396 |
| 2013/0196515 A1* | 8/2013 | Clark | H01L 21/02068 438/763 |
| 2014/0315360 A1 | 10/2014 | Liu et al. | |
| 2015/0021757 A1 | 1/2015 | Lin et al. | |
| 2015/0325572 A1* | 11/2015 | Cheng | H01L 21/762 257/369 |

* cited by examiner

METAL-INSULATOR-SEMICONDUCTOR (MIS) CONTACTS AND METHOD OF FORMING

CROSS-REFERENCE TO RELATED APPLICATIONS

This application is related to and claims priority to U.S. provisional application Ser. No. 62/257,690 filed on Nov. 19, 2015, the entire contents of which are herein incorporated by reference.

FIELD OF INVENTION

The present invention relates to the field of contacts for semiconductor devices, and more particularly to metal-insulator-semiconductor (MIS) contacts and method of forming.

BACKGROUND OF THE INVENTION

Metal silicide thin films are integral parts of all semiconductor devices. They have been used as ohmic contacts, gate electrodes, local interconnects, and diffusion barriers. The many requirements of the metal silicide films include low resistivity, good adhesion to silicon, low contact resistance to silicon, appropriate Schottky or Ohmic barrier height with heavily doped silicon ($n^+$ or $p^+$), thermal stability, appropriate morphology for subsequent lithography and etching, high corrosion resistance, oxidation resistance, good adhesion to and minimal reaction with $SiO_2$, low interface stress, compatibility with other processing steps such as lithography and etching, minimized metal penetration, high electromigration resistance, and formability at low temperature. Metal silicides that have received the most use attention as metal contacts for advanced devices are $TiSi_2$, $CoSi_2$, and NiSi.

As feature dimensions are continuously reduced, new methods and materials are needed for contacts, including contacts with minimum dimensions of about 10 nm and smaller, and for germanium (Ge)-containing devices.

SUMMARY OF THE INVENTION

Embodiments of the invention provide MIS contacts and a method of forming.

According to an embodiment of the invention, the method includes providing a semiconductor substrate containing a contact region, depositing an insulator film on the contact region, the insulator film including a mixed oxide material containing titanium oxide ($TiO_2$) and at least one additional metal oxide. The method further includes depositing a metal-containing electrode layer abutting the insulator film to form a metal-insulator-semiconductor (MIS) structure, and heat-treating the MIS structure to scavenge oxygen from the $TiO_2$ in the insulator film to the metal-containing electrode layer to form a MIS contact with oxygen vacancies in the insulator film. According to one embodiment the at least one additional metal oxide may be selected from the group consisting of hafnium oxide ($HfO_2$), zirconium oxide ($ZrO_2$), aluminum oxide ($Al_2O_3$), and combinations thereof, and the metal-containing electrode layer may be selected from the group consisting of titanium (Ti) metal, aluminum metal (Al), hafnium metal (Hf), zirconium (Zr) metal, tantalum (Ta) metal, niobium (Nb) metal, and a combination thereof.

According to one embodiment, the MIS contact includes a contact region on a semiconductor substrate, and an insulator film with oxygen vacancies on the contact region, the insulator film including a mixed oxide material containing $TiO_2$ with oxygen vacancies and at least one additional metal oxide. The MIS contact further includes a metal-containing electrode layer abutting the insulator film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

A semiconductor device containing a MIS contact and method of forming are described. A MIS contact or capacitor is a capacitor formed from a layer of metal, a layer of insulating material, and a layer of semiconductor material.

Figure 1:
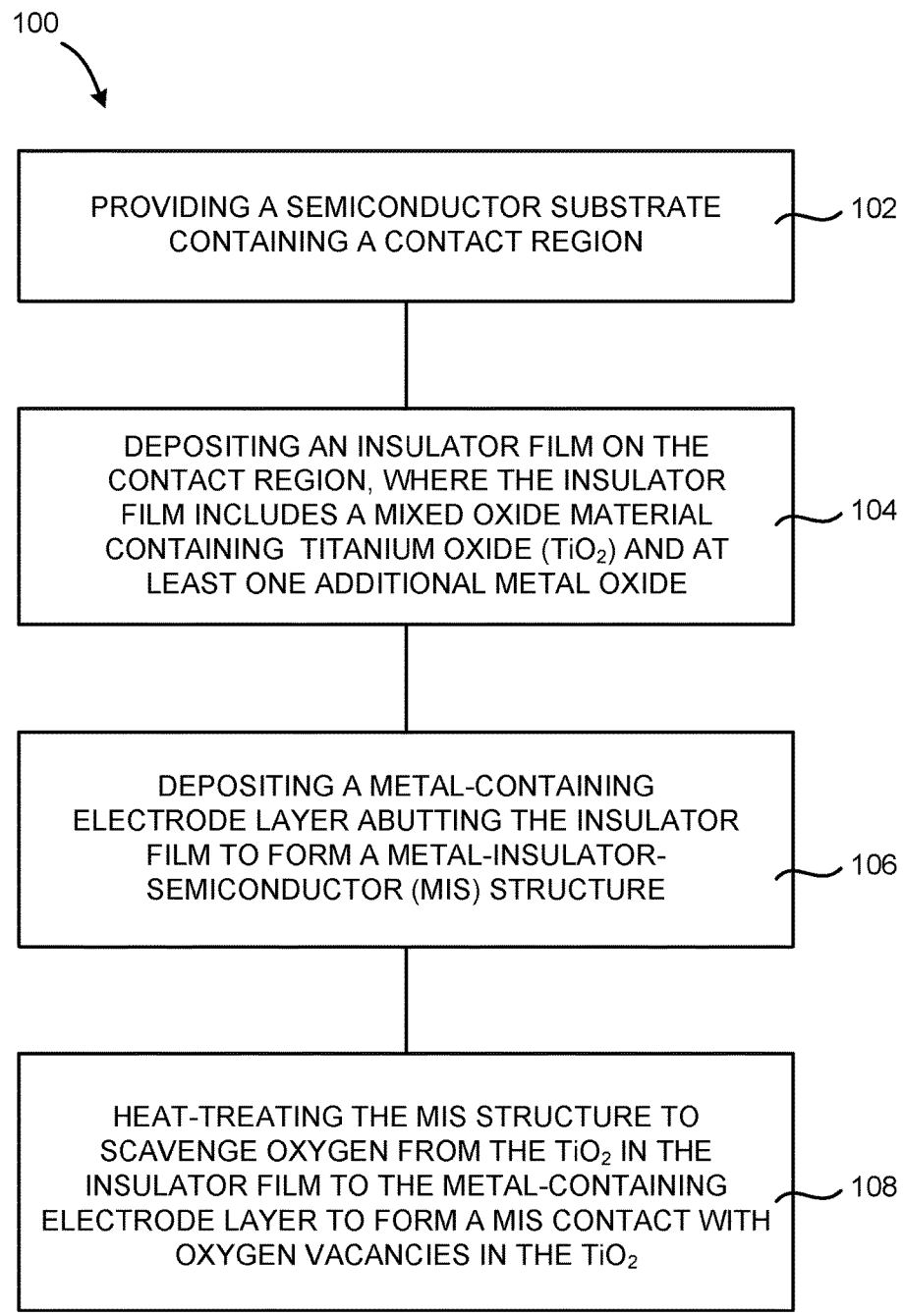
FIG. 1 is a process flow diagram of a method for forming a MIS contact according to an embodiment of the invention.
Figure 2A:
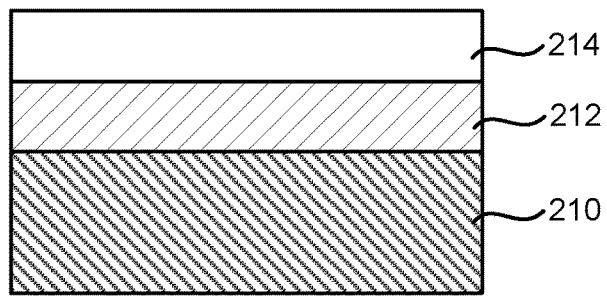
FIG. 2A-2D schematically show through cross-sectional views a method for forming a MIS contact according to an embodiment of the invention.
Figure 2B:
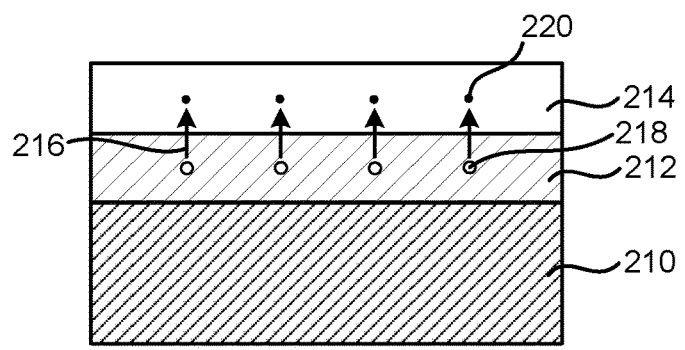

FIG. 1 is a process flow diagram 100 of a method for forming a MIS contact according to an embodiment of the invention, and FIG. 2A-2D schematically show through cross-sectional views a method for forming a MIS contact according to an embodiment of the invention. Referring to FIGS. 1 and 2A, the method includes in step 102, providing a semiconductor substrate containing a contact region 210. The semiconductor substrate may, for example, be selected from the group consisting of silicon (Si), germanium (Ge), silicon germanium (SiGe), and compound semiconductors (e.g., III-V materials). The semiconductor substrate can be of any size, for example a 200 mm substrate, a 300 mm substrate, or an even larger substrate. According to one embodiment, the semiconductor substrate can contain Si, for example crystalline Si, polycrystalline Si, or amorphous Si. In one example, the semiconductor substrate can be a tensile-strained Si layer. According to another embodiment, the semiconductor substrate may contain Ge or $Si_xGe_{1-x}$ compounds, where x is the atomic fraction of Si, 1−x is the atomic fraction of Ge, and $0<(1-x)<1$. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the semiconductor substrate can be a compressive-strained Ge layer or a tensile-strained $Si_xGe_{1-x}$ (x>0.5) deposited on a relaxed $Si_{0.5}Ge_{0.5}$ buffer layer.

In step 104, the method further includes depositing an insulator film 212 on the contact region 210. According to some embodiments, the insulator film 212 includes a mixed oxide material containing $TiO_2$ and at least one additional metal oxide. The at least one additional metal oxide may be selected from the group consisting of $HfO_2$, $ZrO_2$, $Al_2O_3$, and combinations thereof. A thickness of the insulator film 212 is, for example, between about 5 Angstrom (Å) and about 50 Å, between about 5 Å and about 20 Å, or between about 5 Å and about 10 Å. The insulator film 212 may, for example, be deposited by chemical vapor deposition (CVD), atomic layer deposition (ALD), plasma-enhanced CVD (PECVD), or plasma-enhanced ALD (PEALD). According to one embodiment of the invention, ALD or PEALD methods may be utilized due to normally superior uniformity and atomic level thickness control compared to CVD and PECVD methods.

Embodiments of the invention may utilize a wide variety of hafnium, zirconium, aluminum, and titanium precursors to deposit the insulator film 212. In addition, an oxygen-containing gas may be used as an oxidizing source. The oxygen-containing gas can include $O_2$, $H_2O$, or $H_2O_2$, or a combination thereof, and optionally an inert gas such as Ar. For example, representative examples of hafnium and zirconium precursors include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido)hafnium, TEMAH), $Hf(NMe_2)_4$ (tetrakis(dimethylamido)hafnium, TDMAH), $Zr(O^tBu)_4$ (zirconium tert-butoxide, ZTB), $Zr(NEt_2)_4$ (tetrakis(diethylamido)zirconium, TDEAZ), $Zr(NMeEt)_4$ (tetrakis(ethylmethylamido)zirconium, TEMAZ), $Zr(NMe_2)_4$ (tetrakis(dimethylamido)zirconium, TDMAZ), $Hf(mmp)_4$, $Zr(mmp)_4$, $HfCl_4$, $ZrCl_4$, $ZrCp_2Me_2$, $Zr(tBuCp)_2Me_2$, and $Zr(NiPr_2)_4$. In one example, the hafnium and zirconium precursors may have the same ligands (e.g., HTB and ZTB), thereby preventing any possible detrimental ligand exchange between the precursors.

For example, representative examples of titanium precursors include $Ti(NEt_2)_4$ (TDEAT), $Ti(NMeEt)_4$ (TEMAT), $Ti(NMe_2)_4$ (TDMAT), and $TiCl_4$.

For example, many aluminum precursors have the formula:

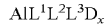

$$AlL^1L^2L^3D_x$$

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles. Other examples of aluminum precursors include: $AlMe_3$, $AlEt_3$, $AlMe_2H$, $[Al(OsBu)_3]_4$, $Al(CH_3COCHCOCH_3)_3$, $AlCl_3$, $AlBr_3$, $AlI_3$, $Al(OiPr)_3$, $[Al(NMe_2)_3]_2$, $Al(iBu)_2Cl$, $Al(iBu)_3$, $Al(iBu)_2H$, $AlEt_2Cl$, $Et_3Al_2(OsBu)_3$, $Al(THD)_3$, $H_3AlNMe_3$, $H_3AlNEt_3$, $H_3AlNMe_2Et$, and $H_3AlMeEt_2$.

Still referring to FIG. 2A, in step 106, the method further includes depositing a metal-containing electrode layer 214 abutting the insulator film 212 to form a MIS structure. The metal-containing electrode layer 214 may, for example, include a low-workfunction metal selected from the group consisting of titanium (Ti) metal, aluminum (Al) metal, hafnium (Hf) metal, zirconium (Zr) metal, tantalum (Ta) metal, niobium (Nb) metal, and a combination thereof. Those metals may be used to form N-type contacts. In one preferred example, the metal-containing electrode layer 214 comprises about 30 Å Ti metal deposited using an ALD or PEALD process. In another example, the metal-containing electrode layer 214 may include a high-workfunction metal or metal compounds selected from the group consisting of titanium nitride (TiN), tantalum nitride (TaN), nickel silicide (NiSi), platinum (Pt) metal, ruthenium (Ru) metal, and a combination thereof. Those metals and metal compounds may be used to form P-type contacts. A thickness of the insulator film 212 is, for example, between about 5 Å and about 50 Å, between about 5 Å and about 20 Å, or between about 5 Å and about 10 Å. The metal-containing electrode layer 214 may, for example, be deposited by sputtering, PVD, CVD, ALD, PECVD, or PEALD.

In step 108, the method further includes heat-treating the MIS structure to scavenge oxygen 220 (solid circles) from the $TiO_2$ in the insulator film 212 to the metal-containing electrode layer 214 to form a MIS contact with oxygen vacancies 218 (open circles) in the insulator film 212. The oxygen scavenging by diffusion is schematically shown by arrows 216 in FIG. 2B. The heat-treating may be performed at a substrate temperature between 400° C. and 1000° C., between 500° C. and 950° C., between 400° C. and 800° C., between 600° C. and 1000° C., or between 800° C. and 1000° C. The heat-treating may be performed for a time period between about 10 seconds and 600 seconds, for example about 300 seconds. The heat-treating may be performed under substantially oxygen-free reduced pressure conditions with or without the use of an inert gas. In one example, the heat-treating may be performed in an inert atmosphere at a pressure less than 100 Torr with less than 0.1% $O_2$ gas in the inert atmosphere. In one example, the heat-treating may be performed at a pressure below 1 mTorr, below 0.1 mTorr, or below 0.01 mTorr, in the absence of an inert gas. When an inert gas is used, the inert gas may be selected from $N_2$ gas and the noble gases. Exemplary heat-treating conditions that use an inert gas may include an inert gas pressure in a range from about 1 mTorr to about 100 Torr, or in a range from about 100 mTorr to about 10 Torr. However, embodiments of the invention are not limited by these heat-treating conditions as other heat-treating conditions may be utilized.

Figure 2C:
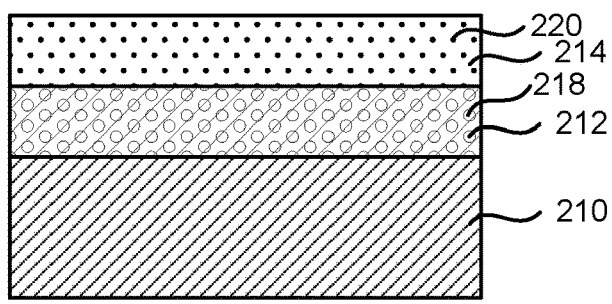

FIG. 2C schematically shows the MIS contact following the heat-treating, illustrating the oxygen vacancies 218 in the insulator film 212 and the oxygen 220 diffused into the metal-containing electrode layer 214. The heat-treated insulator film 212 is thermodynamically stable on a Si contact region 210 and, due to the oxygen diffusion into the metal-containing electrode layer 214, is Ti-doped with Ti metal centers that have oxidation states less than 4. This allows good electrical conduction through the MIS contact and the heat-treated insulator film 212 can further screen metal-induced gap states (MIGS) and provide a dipole to reduce the Schottky Barrier Height (SBH). $HfO_2$, $ZrO_2$, and $Al_2O_3$ are all metal oxides that are well suited for hosting such reduced titanium oxide species. For example, $ZrO_2$ has the smallest conduction band offset (CBO) compared to the other dielectric materials except $TiO_2$ and is thermally stable to survive the heat-treating. $Al_2O_3$ has the largest band gap and also the highest thermal stability of the dielectric materials.

Figure 2D:
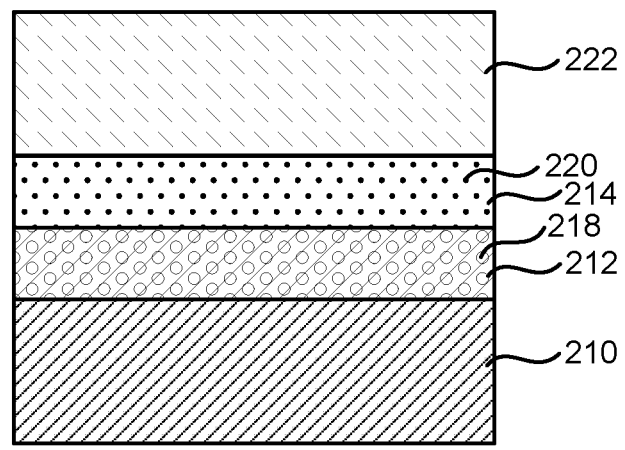

FIG. 2D schematically shows an additional metal electrode layer 222 formed on the metal-containing electrode layer 214. The additional metal electrode layer 222 can, for example, contain tungsten or copper.

Figure 3:
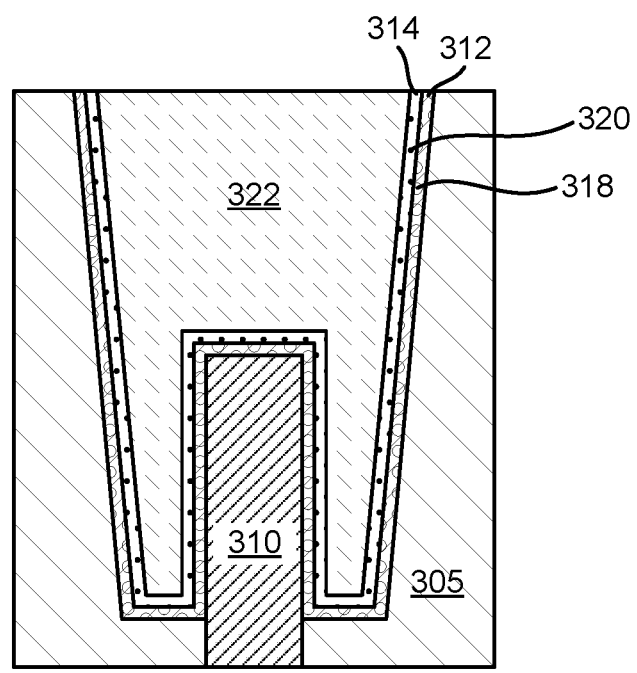
FIG. 3 schematically shows through a cross-sectional view a MIS contact that includes a fin structure in a recessed feature according to an embodiment of the invention.

FIG. 3 schematically shows through a cross-sectional view a MIS contact that includes a fin structure in a recessed feature according to an embodiment of the invention. For thin body and fin structures, MIS contacts are expected to have an area advantage over traditional metal silicide materials. The figure shows a fin 310 (e.g., Si) at the bottom of a filled recessed feature in a substrate 305, an insulator film 312 with oxygen vacancies 318 on the fin 310, a metal-containing electrode layer 314 containing oxygen 220 diffused from the insulator film 312, and an additional metal electrode layer 322. The MIS contact in the figure may be formed as described above in reference to FIGS. 1 and 2A-2D. For thin body and fin structures, such as the example shown in FIG. 3, MIS contacts are expected to have an area advantage over traditional metal silicide materials.

Metal-insulator-semiconductor (MIS) contacts and method of forming have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, the method comprising:
    providing a semiconductor substrate containing a contact region;
    depositing an insulator film on the contact region, the insulator film including a mixed oxide material containing a mixture of titanium oxide ($TiO_2$) and at least one additional metal oxide;
    depositing a metal-containing electrode layer abutting the insulator film to form a metal-insulator-semiconductor (MIS) structure; and
    heat-treating the MIS structure to scavenge oxygen from the $TiO_2$ in the insulator film to the metal-containing electrode layer to form a MIS contact with oxygen vacancies in the $TiO_2$.

2. The method of claim 1, wherein the at least one additional metal oxide is selected from the group consisting of hafnium oxide ($HfO_2$), zirconium oxide ($ZrO_2$), aluminum oxide ($Al_2O_3$), and combinations thereof.

3. The method of claim 1, wherein the semiconductor substrate is selected from the group consisting of silicon (Si), germanium (Ge), silicon germanium (SiGe), and compound semiconductors.

4. The method of claim 1, wherein the metal-containing electrode layer is selected from the group consisting of titanium (Ti) metal, aluminum metal (Al), hafnium metal (Hf), zirconium (Zr) metal, tantalum (Ta) metal, niobium (Nb) metal, and a combination thereof.

5. The method of claim 1, wherein the metal-containing electrode layer is selected from the group consisting of titanium nitride (TiN), tantalum nitride (TaN), nickel silicide (NiSi), platinum (Pt) metal, ruthenium (Ru) metal, and a combination thereof.

6. The method of claim 1, wherein the metal-containing electrode layer is deposited by an ALD or PEALD process.

7. The method of claim 1, wherein the contact region is located at the bottom of a recessed feature in the semiconductor substrate.

8. The method of claim 1, wherein the contact region includes a fin structure in a recessed feature in the semiconductor substrate, the fin structure including a fin, the insulator film on the fin, and the metal-containing electrode layer on the insulator film.

9. The method of claim 1, wherein the insulator film is deposited by an ALD or PEALD process.

10. A method of forming a semiconductor device, the method comprising:
    providing a semiconductor substrate containing a contact region;
    depositing an insulator film on the contact region, the insulator film including a mixed oxide material containing a mixture of titanium oxide ($TiO_2$) and at least one additional metal oxide selected from the group consisting of hafnium oxide ($HfO_2$), zirconium oxide ($ZrO_2$), aluminum oxide ($Al_2O_3$), and combinations thereof;
    depositing a metal-containing electrode layer abutting the insulator film to form a metal-insulator-semiconductor (MIS) structure, wherein the metal-containing electrode layer is selected from the group consisting of titanium (Ti) metal, aluminum (Al) metal, and a combination thereof; and
    heat-treating the MIS structure to scavenge oxygen from the $TiO_2$ in the insulator film to the metal-containing electrode layer to form a MIS contact with oxygen vacancies in the $TiO_2$.

11. The method of claim 10, wherein the semiconductor substrate is selected from the group consisting of silicon (Si), germanium (Ge), silicon germanium (SiGe), and compound semiconductors.

12. The method of claim 10, wherein the contact region is located at the bottom of a recessed feature in the semiconductor substrate.

13. The method of claim 10, wherein the contact region includes a fin structure in a recessed feature in the semiconductor substrate, the fin structure including a fin, the insulator film on the fin, and the metal-containing electrode layer on the insulator film.

14. A metal-insulator-semiconductor (MIS) contact, comprising:
    a contact region in a semiconductor substrate;
    an insulator film on the contact region, the insulator film including a mixed oxide material containing a mixture of titanium oxide ($TiO_2$) with oxygen vacancies that are not neutralized and at least one additional metal oxide; and
    a metal-containing electrode layer abutting the insulator film.

15. The contact of claim 14, wherein the at least one additional metal oxide is selected from the group consisting of hafnium oxide ($HfO_2$), zirconium oxide ($ZrO_2$), aluminum oxide ($Al_2O_3$), and combinations thereof.

16. The contact of claim 14, wherein the semiconductor substrate is selected from the group consisting of silicon (Si), germanium (Ge), silicon germanium (SiGe), and compound semiconductors.

17. The contact of claim 14, wherein the metal-containing electrode layer is selected from the group consisting of titanium (Ti) metal, aluminum metal (Al), hafnium metal (Hf), zirconium (Zr) metal, tantalum (Ta) metal, niobium (Nb) metal, and a combination thereof.

18. The contact of claim 14, wherein the metal-containing electrode layer is selected from the group consisting of titanium nitride (TiN), tantalum nitride (TaN), nickel silicide (NiSi), platinum (Pt) metal, ruthenium (Ru) metal, and a combination thereof.

19. The contact of claim 14, wherein the contact region is located at the bottom of a recessed feature in the semiconductor substrate.

20. The contact of claim 14, wherein the contact region includes a fin structure in a recessed feature in the semiconductor substrate, the fin structure including a fin, the insulator film on the fin, and the metal-containing electrode layer on the insulator film.

\* \* \* \* \*